(12) United States Patent
Hwang

(10) Patent No.: US 7,600,667 B2
(45) Date of Patent: Oct. 13, 2009

(54) METHOD OF ASSEMBLING CARBON NANOTUBE REINFORCED SOLDER CAPS

(75) Inventor: Chi-won Hwang, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 11/537,544

(22) Filed: Sep. 29, 2006

(65) Prior Publication Data

US 2008/0078813 A1 Apr. 3, 2008

(51) Int. Cl.
*B23K 31/02* (2006.01)
*B23K 35/12* (2006.01)
*B23K 31/00* (2006.01)

(52) U.S. Cl. .............. 228/180.22; 228/246; 228/248.1

(58) Field of Classification Search .... 228/178–180.22, 228/245, 246, 248.1, 175, 176; 438/612
See application file for complete search history.

(56) References Cited

U.S. PATENT DOCUMENTS

| | | | | |
|---|---|---|---|---|
| 4,209,893 A * | 7/1980 | Dyce et al. | ................. | 29/522.1 |
| 4,412,642 A * | 11/1983 | Fisher, Jr. | ................. | 228/173.1 |
| 4,712,721 A * | 12/1987 | Noel et al. | ................. | 228/56.3 |
| 4,906,823 A * | 3/1990 | Kushima et al. | ............ | 228/245 |
| 5,323,947 A * | 6/1994 | Juskey et al. | ............... | 228/56.3 |
| 5,497,938 A * | 3/1996 | McMahon et al. | .......... | 228/253 |
| 5,662,262 A * | 9/1997 | McMahon et al. | ......... | 228/56.3 |
| 5,739,053 A * | 4/1998 | Kawakita et al. | ............ | 438/108 |
| 5,846,366 A * | 12/1998 | Jin et al. | ..................... | 156/233 |
| 5,857,610 A * | 1/1999 | Hoshiba et al. | ............. | 228/246 |
| 5,861,323 A * | 1/1999 | Hayes | ......................... | 438/111 |
| 5,873,512 A * | 2/1999 | Bielick et al. | ............... | 228/216 |
| 5,982,629 A * | 11/1999 | Shoji et al. | .................. | 361/760 |
| 6,204,094 B1 * | 3/2001 | Hotchkiss et al. | ........... | 438/120 |
| 6,214,636 B1 * | 4/2001 | Sawayama et al. | ............ | 438/57 |
| 6,247,640 B1 * | 6/2001 | Kuwazaki et al. | ........... | 228/245 |
| 6,251,765 B1 * | 6/2001 | Fukano et al. | .............. | 438/612 |
| 6,281,105 B1 * | 8/2001 | Cotte et al. | .................. | 438/612 |
| 6,297,142 B1 * | 10/2001 | Mita et al. | ................... | 438/612 |
| 6,336,262 B1 * | 1/2002 | Dalal et al. | ................. | 29/25.42 |
| 6,344,234 B1 * | 2/2002 | Dalal et al. | ................. | 427/96.8 |
| 6,404,047 B1 * | 6/2002 | Haley et al. | .................. | 257/698 |
| 6,550,666 B2 * | 4/2003 | Chew et al. | ............ | 228/180.22 |
| 6,723,629 B2 * | 4/2004 | Hotchkiss et al. | ........... | 438/612 |
| 6,812,125 B1 * | 11/2004 | Mostafazadeh | ............. | 438/613 |
| 6,855,623 B2 * | 2/2005 | Ball | ........................... | 438/612 |

(Continued)

FOREIGN PATENT DOCUMENTS

JP 2005032885 A * 2/2005

OTHER PUBLICATIONS

Hwang, C.-W., "Carbon Nanotube Reinforced Metallic Layer", U.S. Appl. No. 11/292,690, filed Dec. 2, 2005.

*Primary Examiner*—Kiley Stoner
*Assistant Examiner*—Carlos Gamino

(57) ABSTRACT

A method of making a carbon nanotube reinforced solder cap. Carbon nanotube-solder (CNT-S) particles are transferred from a transfer substrate, having an adhesive layer, to a solder bump by using thermo compression bonding. The CNT-S particles are then reflowed to form a cap on the solder bump. The solder bump with the reflowed cap can then be joined to a bonding pad or another solder bump with a cap by placing the solder bump on the pad or other bump and reflowing at a temperature sufficient to reflow the cap(s).

14 Claims, 9 Drawing Sheets

U.S. PATENT DOCUMENTS

| | | | |
|---|---|---|---|
| 6,881,612 B2 * | 4/2005 | Miyasaka | 438/118 |
| 7,032,807 B2 * | 4/2006 | Bayot | 228/180.22 |
| 7,059,512 B2 * | 6/2006 | Arita et al. | 228/254 |
| 7,078,821 B2 * | 7/2006 | Matsunami | 257/780 |
| 7,122,897 B2 * | 10/2006 | Aiba et al. | 257/738 |
| 7,160,796 B2 * | 1/2007 | Tamadate | 438/612 |
| 7,240,822 B2 * | 7/2007 | Takeuchi et al. | 228/246 |
| 2005/0139642 A1 * | 6/2005 | Koning et al. | 228/245 |
| 2007/0145097 A1 * | 6/2007 | Suh | 228/101 |

* cited by examiner

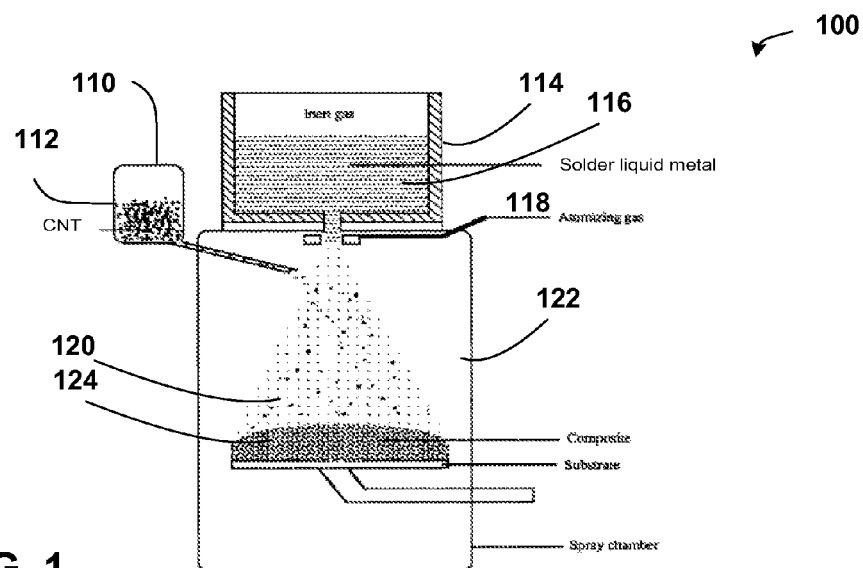
FIG. 1
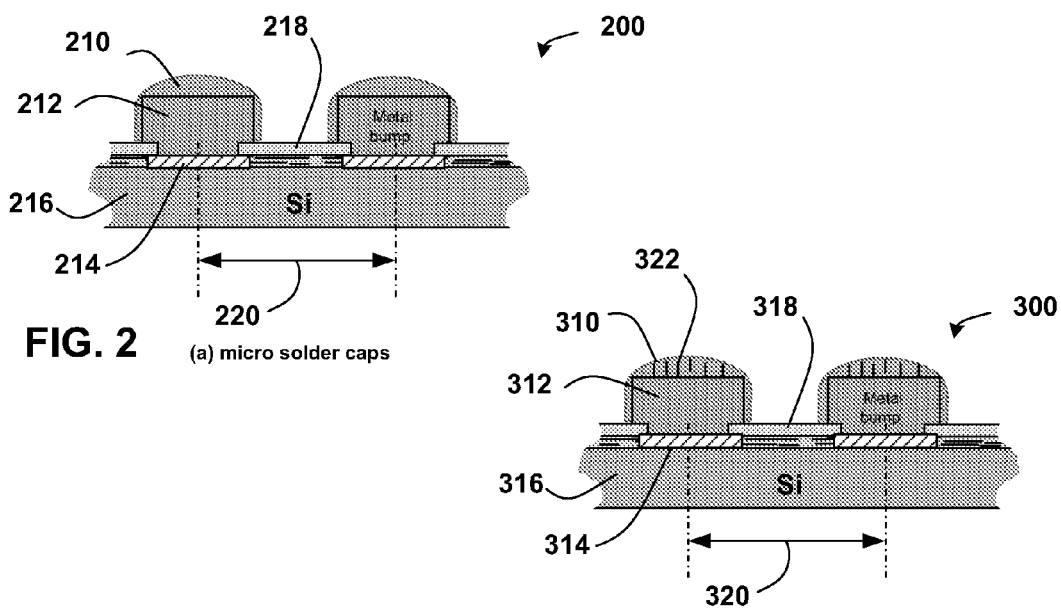
FIG. 2 (a) micro solder caps
FIG. 3 (a) CNT composite micro solder caps

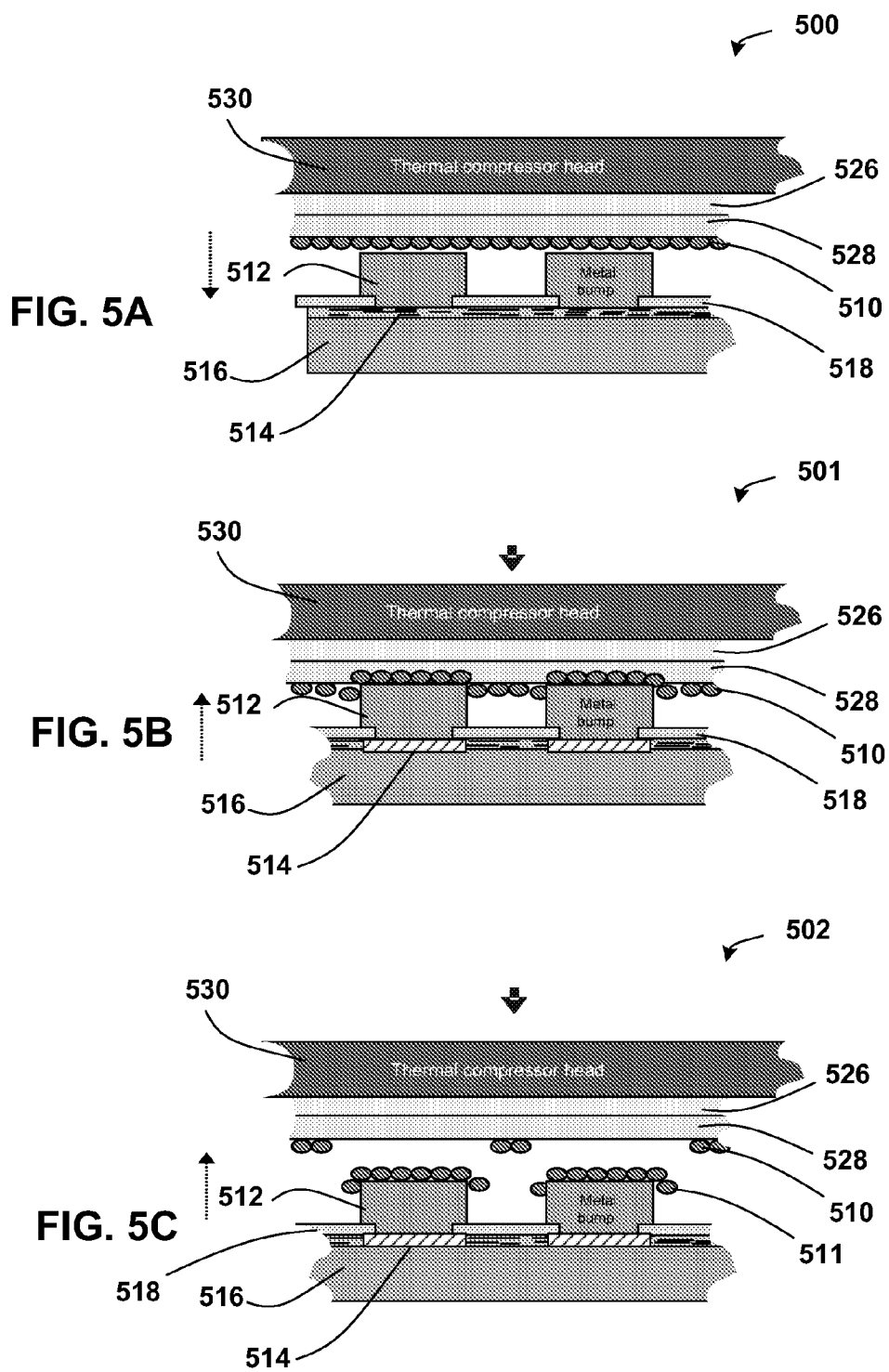

METHOD OF ASSEMBLING CARBON NANOTUBE REINFORCED SOLDER CAPS

TECHNICAL FIELD

Embodiments relate generally to integrated circuit fabrication. More particularly, embodiments relate to solder cap materials in connection with microelectronic devices.

TECHNICAL BACKGROUND

Solders are an important part of a packaged integrated circuit (IC). An IC die is often fabricated into a microelectronic device such as a processor. The solders complete couplings between the IC die and the outside world.

The increasing demands upon an IC to perform at high speeds and to not overheat presents problems for the solders. The increasing heat stresses in an IC package causes thermal stresses between the solders and the substrates to which the solders are bonded.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which:

FIG. 1 is a process depiction during formation of carbon nanotube-impregnated solder particles according to an embodiment;

FIG. 2 is a cross-section elevation of a package that includes a micro solder cap disposed upon a metal bump according to an embodiment;

FIG. 3 is a cross-section elevation of a package that includes a carbon nanotube solder cap disposed upon a metal bump according to an embodiment;

FIG. 5A is a cross-section elevation of thermo compression bonding a carbon nanotube solder particle according to an embodiment;

FIG. 5B is a cross-section elevation of thermo compression bonding the carbon nanotube solder particle depicted in FIG. 5A after further processing according to an embodiment;

FIG. 5C is a cross-section elevation the carbon nanotube solder particle depicted in FIG. 5B after thermo compression bonding;

DETAILED DESCRIPTION

Figure 4A:
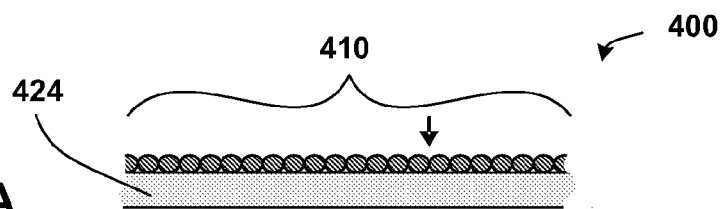
FIG. 4A is a cross-section elevation of preparing a carbon nanotube solder particle for bonding according to an embodiment.

Embodiments in this disclosure relate to a carbon nanotube solder (CNT-S) cap that is coupled to an IC substrate. One way to improve electrical and heat conductivity is to improve the electrical and heat conductivity in the solder bumps that are used to connect an IC package. Bonding of a CNT-S particle is done at a temperature that approaches the homologous temperature.

The following description includes terms, such as upper, lower, first, second, etc. that are used for descriptive purposes only and are not to be construed as limiting. The embodiments of an apparatus or article described herein can be manufactured, used, or shipped in a number of positions and orientations.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

FIG. 1 is a process depiction 100 during formation of carbon nanotube-impregnated solder particles according to an embodiment. A CNT reservoir 110 contains a collection of CNT fibers 112 that are to be mingled with solder. A solder crucible 114 contains molten solder 116. An atomizing gas is introduced at a gas-liquid orifice 118 that causes the molten solder to atomize into particles in a size range from about 5 nanometer (nm) to about 15 nm. In an embodiment, an average particle size that is formed during atomizing of the molten solder 116 is about 6 nm. In an embodiment and in order to prevent premature solidification of the molten solder 116 that is being atomized, the atomizing gas is preheated. In an embodiment, a coil heat exchanger preheats the atomizing gas by economizing heat exchange with the molten solder 116, such that the atomizing gas is virtually the same temperature as the molten solder 116 as it exits at the gas-liquid orifice 118. The atomizing gas can be a non-reactive gas such as argon (Ar) or other non-reactive gases.

After atomizing the molten solder 116 at the gas-liquid orifice 118, the CNT fibers 112 are injected into the atomized solder in a falling mixture 120. In an embodiment, the temperature of the CNT fibers 112 is slightly below that of the atomized solder, such that the CNT fibers 112 have a cooling and solidifying effect upon the falling solder. The falling mixture 120 is contained within a chamber 122 and it accumulates into a plurality of CNT-S particles 124. The CNT fibers have a dimension of about 2-8 nm in length according to an embodiment.

In an embodiment, the solder 116 is a copper-based solder such as pure copper, copper-tin, copper-tin-lead, copper-tin-silver, copper-tin-bismuth, copper-tin-indium and others.

In an embodiment, the solder 116 is a nickel-based solder such as pure nickel, nickel-tin, nickel-tin-lead, nickel-tin-silver, nickel-tin-bismuth, nickel-tin-indium and others. In an embodiment, the solder 116 is a nickel-titanium shape-memory alloy such as NITINOL®, manufactured by Johnson-Matthey of Wayne, Pa.

In an embodiment, the solder 116 is a tin-based solder such as pure tin, tin-nickel, tin-lead, tin-indium, tin-lead-nickel, tin-nickel-silver, and others. In an embodiment, the solder 116, by weight percent, is approximately Sn-10 In-0.6 Cu. In this depiction, the solder 116 includes about 10 percent indium, about 0.6 percent copper, and the balance tin. Other impurities may be present, based upon the specific feedstocks obtained and the chemical purities thereof.

In an embodiment, the solder 116 is an indium-based solder such as pure indium, indium-tin, indium-lead, indium-lead-nickel, indium-nickel-silver, and others.

FIG. 2 is a cross-section elevation of a package 200 that includes a microsolder cap 210 disposed upon a metal bump 212 according to an embodiment. A bonding pad 214 supports the metal bump 212. A substrate 216 supports the metal bump 212. The bonding pad 214 is exposed through a solder mask 218. In an embodiment, the bond pad 214 includes a flash layer 220, such as a gold flash layer upon a copper bond pad.

In an embodiment, the substrate 216 is an IC die. In an embodiment, the substrate 216 is a mounting substrate such as for mounting a flip-chip IC die. In an embodiment, the substrate 216 is a board such as a motherboard.

In an embodiment, the size of the metal bump 212 can be ascertained by the size of the bond pad 214. In an embodiment, the bond pad 214 is about 106 micrometers (μm). Other dimensions can be selected depending upon the application. For example, spacing 220 between centers of bond pads 214 can be less than about 100 μm. In an embodiment, spacing 220 between centers of bond pads 214 is about 90 μm.

In an embodiment, the solder cap 210 is derived from a nano-particulate solder paste, about 100 percent of which pass the 20 nm screening, and the matrix includes a paste such as a fluxing agent and a volatile component. After reflow, the microsolder cap 210 exhibits an average grain size of about 20 μm.

FIG. 3 is a cross-section elevation of a package 300 that includes a carbon nanotube solder cap 310 disposed upon a metal bump 312 according to an embodiment. A bonding pad 314 supports the metal bump 312. A substrate 316 supports the metal bump 312. The bonding pad 314 is exposed through a solder mask 318. A network 322 of carbon nanotubes is dispersed in the solder cap 310. In an embodiment, the network 322 of carbon nanotubes is present in the solder of the solder cap 310 in a range from about 1 to about 99 volume percent of the solder cap 310. In an embodiment, the network 322 of carbon nanotubes is present in the solder of the solder cap 310 in a range from about 10 to about 70 volume percent. In an embodiment, the network 322 of carbon nanotubes is present in the solder of the solder cap 310 in a range from about 20 to about 50 volume percent. In an embodiment, the network 322 of carbon nanotubes is present in the solder of the solder cap 310 in a range from about 30 to about 40 volume percent.

In an embodiment, the bonding pad 314 includes a flash layer 320, such as a gold flash layer upon a copper bond pad. In an embodiment, the substrate 316 is an IC die. In an embodiment, the substrate 316 is a mounting substrate such as for mounting a flip-chip IC die. In an embodiment, the substrate 316 is a board such as a motherboard.

In an embodiment, the size of the metal bump 312 can be ascertained by the size of the bond pad 314. In an embodiment, the bond pad 314 is about 106 μm. Other dimensions can be selected depending upon the application. For example, spacing 320 between centers of bond pads 314 can be less than about 100 μm. In an embodiment, spacing 320 between centers of bond pads 314 is about 90 μm.

FIG. 4A is a cross-section elevation of a method 400 for preparing a carbon nanotube solder particle for bonding according to an embodiment. A rigid substrate 424 has received a layer of CNT-S particles 410 according to any of the embodiments set forth in this disclosure. In an embodiment, the CNT-S particles 410 form a monolayer over the rigid substrate 424, such that a monolayer can be transferred to a metal bump. Accordingly, the monolayer of CNT-S particles 412 will form a micro CNT-S cap that is proportional to the particle size of the CNT-S particles 412.

Figure 4B:
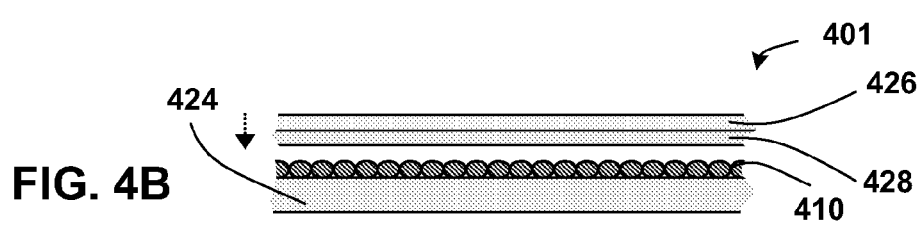
FIG. 4B is a cross-section elevation of preparing the carbon nanotube solder particle depicted in FIG. 4A after further processing according to an embodiment.

FIG. 4B is a cross-section elevation of the method for preparing the carbon nanotube solder particle depicted in FIG. 4A after further processing according to an embodiment. The method 401 illustrates a flexible sheet 426 being brought toward the CNT-S particles 410. The flexible sheet 426 has an adhesive 428.

Figure 4C:
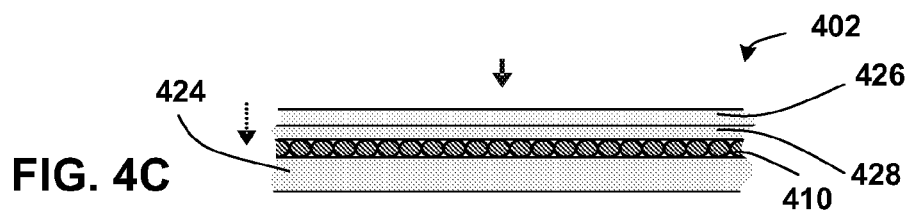
FIG. 4C is a cross-section elevation of preparing the carbon nanotube solder particle depicted in FIG. 4B after further processing.

FIG. 4C is a cross-section elevation of preparing the carbon nanotube solder particle depicted in FIG. 4B after further processing. The method 402 illustrates the flexible sheet 426 being pressed against the CNT-S particles 410. Consequently, a transfer of the CNT-S particles 410 is achieved by the adhesive 428 picking up the CNT-S particles 410 from the surface of the rigid substrate 424.

Figure 4D:
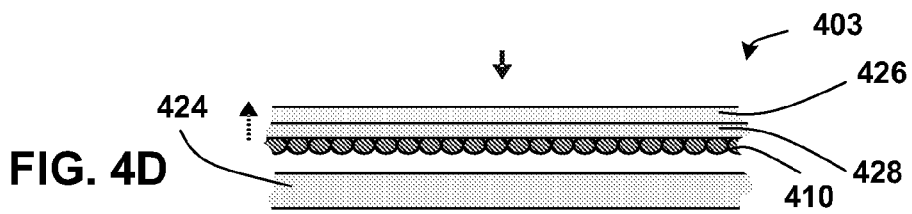
FIG. 4D is a cross-section elevation of preparing the carbon nanotube solder particle depicted in FIG. 4C after further processing.

FIG. 4D is a cross-section elevation of preparing the carbon nanotube solder particle depicted in FIG. 4C after further processing. The method 403 illustrates the flexible sheet 426 being drawn away from the rigid substrate 424 with the CNT-S particles 410 affixed to the adhesive 428 and the flexible sheet 426.

FIG. 5A is a cross-section elevation of thermo compression bonding a carbon nanotube solder particle according to an embodiment. A bonding pad 514 supports a metal bump 512. A substrate 516 supports the bonding pad 514. The bonding pad 514 is exposed through a solder mask 518.

A flexible sheet 526 and an adhesive 528 hold a layer of CNT-S particles 510 that includes a network of carbon nanotubes dispersed in the CNT-S particles 510. The process 500 is illustrated with a thermal compression head 530 depicted being brought close to the metal bump 512, with the CNT-S particles 510 approaching the metal bump 512.

FIG. 5B is a cross-section elevation of thermo compression bonding the carbon nanotube solder particle depicted in FIG. 5A after further processing according to an embodiment. The process 501 is further illustrated with the thermal compression head 530 pressing the CNT-S particles 510 against the metal bump 512. In an embodiment, the temperature of the CNT-S particles 510 is controlled not to exceed the melting point of thereof. Particularly because compression can cause heating, as well as thermal flux being driven out of the thermal compression head 530 such as by an electrical coil contained therein, temperature control takes both heating effects into account. In an embodiment, the temperature of the CNT-S particles 510 does not exceed about 99 percent of the homologous temperature, which is the achieved temperature (in absolute scale) divided by the solidus temperature. In other words, the solidus temperature, which is the temperature at which a solid starts to become a liquid at standard atmospheric pressure, is not reached. In an embodiment, the temperature of the CNT-S particles 510 does not exceed about 99.9 percent of the homologous temperature.

FIG. 5C is a cross-section elevation of the carbon nanotube solder particle depicted in FIG. 5B after thermo compression bonding. The process 502 is further illustrated with the thermal compression head 530 retracting from the CNT-S particles, some of which CNT-S particles 511 remain disposed against the metal bump 512, and some of which CNT-S particles 510 remain disposed against the adhesive 528.

Figure 6A:
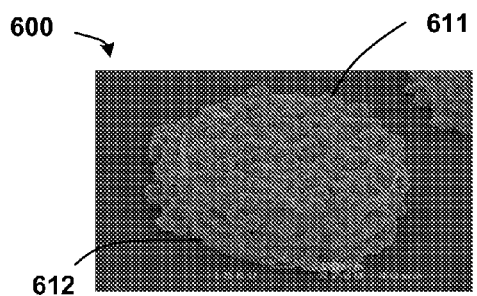
FIG. 6(a) is a computer-image depiction of a photomicrograph that exhibits carbon nanotube solder particles disposed upon a metal bump according to an embodiment.

FIG. 6A is a computer-image depiction of a photomicrograph 600 that exhibits carbon nanotube solder particles 611 disposed upon a metal bump 612 according to an embodiment. The CNT-S particles 611 have been thermal compression bonded to the metal bump 612.

Figure 6B:
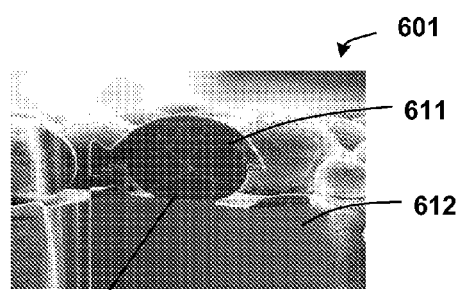
FIG. 6(b) is a computer-image cross-section elevation depiction of a photomicrograph that exhibits a carbon nanotube solder particle disposed upon a metal bump according to an embodiment.

FIG. 6B is a computer-image cross-section elevation depiction of a photomicrograph 601 that exhibits a carbon nanotube solder particle 611 disposed upon a metal bump 612 according to an embodiment. The computer-image of FIG. 6B is more enlarged than the computer-image of FIG. 6A. The CNT-S particle 611 shows a thermal compression bond line 632 between the CNT-S particle 611 and the metal bump 612.

Figure 7A:
FIG. 7A is a cross-section elevation of a carbon nanotube solder particle after thermo compression bonding according to an embodiment.

FIG. 7A is a cross-section elevation of a carbon nanotube solder particle after thermo compression bonding according to an embodiment. A package 700 is illustrated with some CNT-S particles 711 remaining thermal compression bonded against a metal bump 712. A bonding pad 714 supports the metal bump 712. A substrate 716 supports the bonding pad 714. The bonding pad 714 is exposed through a solder mask 718.

Figure 7B:
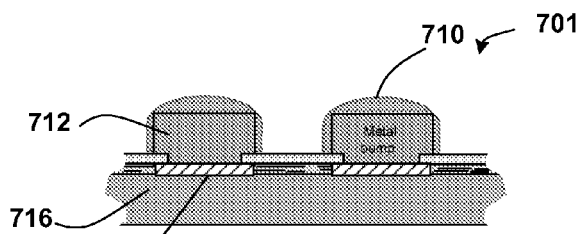
FIG. 7B is a cross-section elevation of the structure depicted in FIG. 7A after solder cap reflow according to an embodiment.

FIG. 7B is a cross-section elevation of the structure depicted in FIG. 7A after solder cap reflow according to an embodiment. The package 701 is illustrated after reflow of CNT-S particles into a CNT-S microcap 710.

Figure 8A:
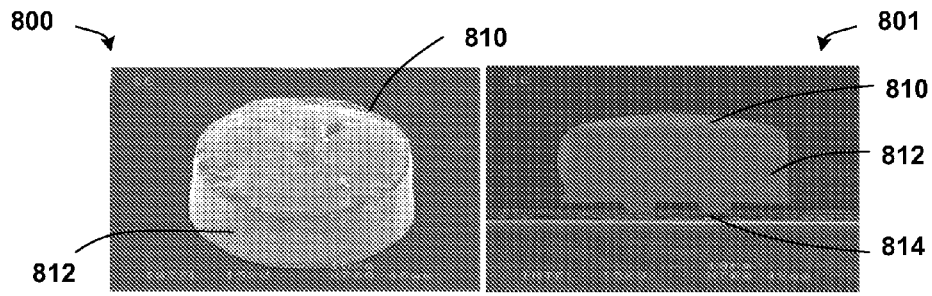
FIG. 8(a) is a computer-image depiction of a photomicrograph that exhibits reflowed carbon nanotube solder particles disposed upon a metal bump according to an embodiment.

FIG. 8A is a computer-image depiction of a photomicrograph 800 that exhibits reflowed carbon nanotube solder particles disposed upon a metal bump according to an embodiment. Reflowed CNT-S particles have formed a CNT-S microcap 810, disposed and bonded to a metal bump 812.

Figure 8B:
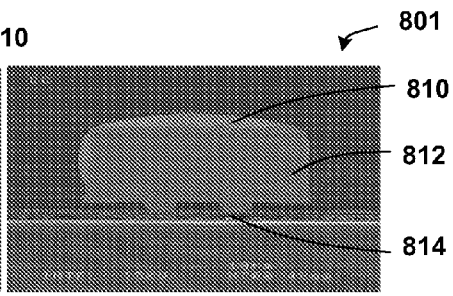
FIG. 8(b) is a computer-image cross-section elevation depiction of a photomicrograph that exhibits reflowed carbon nanotube solder particles disposed upon a metal bump according to an embodiment.

FIG. 8B is a computer-image cross-section elevation depiction of a photomicrograph 801 that exhibits reflowed carbon nanotube solder particles disposed upon a metal bump according to an embodiment. The cross section shows the CNT-S microcap 810, the metal bump 812, and penetration of a portion of the metal bump 812 onto a bonding pad 814.

Figure 9A:
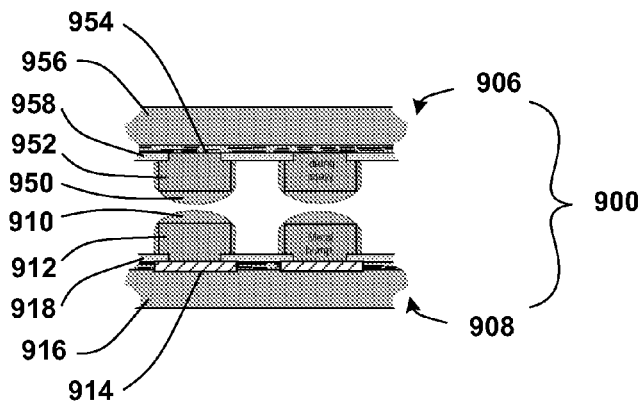
FIG. 9A is a cross-section elevation of a structure after solder cap reflow according to an embodiment.

FIG. 9A is a cross-section elevation of a package 900 after solder cap reflow according to an embodiment. In a first structure 908, a first CNT-S microcap 910 is disposed upon a first metal bump 912. A first bonding pad 914 supports the first metal bump 912. A first substrate 916 supports the first bonding pad 914. The first bonding pad 914 is exposed through a first solder mask 918. In an embodiment, the first substrate 916 is an IC die. In an embodiment, the first substrate 916 is a mounting substrate such as for mounting a flip-chip IC die. In an embodiment, the first substrate 916 is a board such as a motherboard.

In a second structure 906, a second CNT-S microcap 950 is disposed upon a second metal bump 952. A second bonding pad 954 supports the second metal bump 952. A second substrate 956 supports the second bonding pad 954. The second bonding pad 954 is exposed through a second solder mask 958. In an embodiment, the second substrate 956 is an IC die. In an embodiment, the second substrate 956 is a mounting substrate such as for mounting a flip-chip IC die. In an embodiment, the second substrate 956 is a board such as a motherboard.

The package 900 is depicted being brought together such that the first metal bump 912 and the second metal bump 952 are to be in direct contact with the first solder cap 910. Similarly, the first metal bump 912 and the second metal bump 952 are to be in direct contact with the second solder cap 950. This is because the first solder cap 910 and the second solder cap 950 are to meld and form a continuous reflowed CNT-S microcap.

Processing of the first solder cap 910 and the second solder cap 950 can be done by heating the solder cap materials to a low temperature at which the solder cap materials begin to reflow.

Figure 9B:
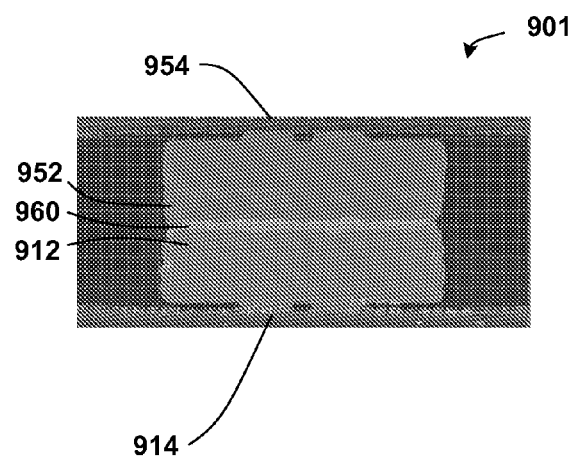
FIG. 9B is a computer-image cross-section elevation depiction of a photomicrograph that exhibits a solder-cap-on-solder-cap configuration of carbon nanotube solder particles disposed upon metal bumps according to an embodiment.

FIG. 9B is a computer-image cross-section elevation depiction of a photomicrograph 901 that exhibits a solder-cap-on-solder-cap configuration of carbon nanotube solder particles disposed upon metal bumps according to an embodiment. After bringing the structures 908 and 906 together (FIG. 9A), and after reflowing the two CNT-S microcaps 910 and 950, a structure results that is a configuration of the first CNT-S microcap 910 disposed and melded with the second CNT-S microcap 950. The conjoined CNT-S microcaps 910 and 950 appear in FIG. 9B as a bond line 960.

Figure 10:
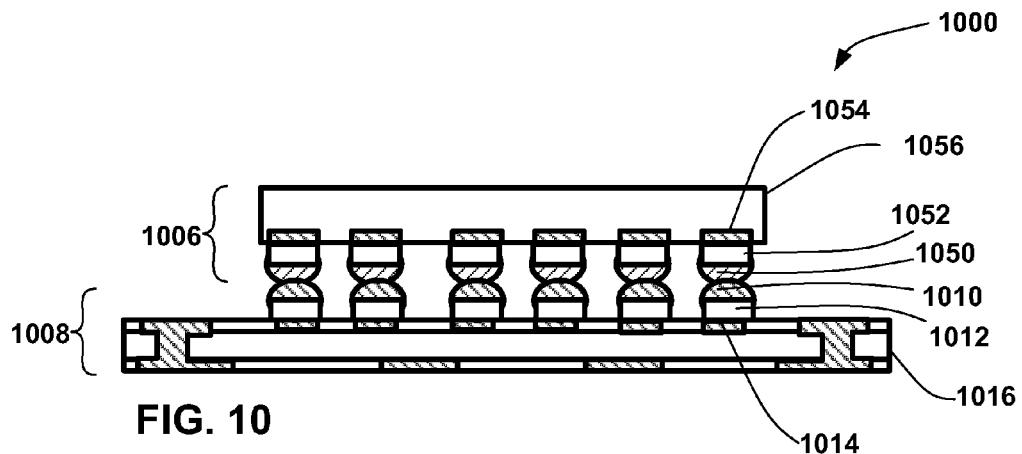
FIG. 10 is a cross-section elevation of a chip package that exhibits a solder-cap-on-solder-cap configuration of carbon nanotube solder particles disposed upon metal bumps according to an embodiment.

FIG. 10 is a cross-section elevation of a chip package 1000 that exhibits a solder-cap-on-solder-cap configuration of carbon nanotube solder particles disposed upon metal bumps according to an embodiment.

In a first structure 1008, a first CNT-S microcap 1010 is disposed upon a first metal bump 1012. A first bonding pad 1014 supports the first metal bump 1012. A first substrate 1016 supports the first bonding pad 1014. In an embodiment, the first substrate 1016 is a mounting substrate such as for mounting a flip-chip IC die.

In a second structure 1006, a second CNT-S microcap 1050 is disposed upon a second metal bump 1052. A second bonding pad 1054 supports the second metal bump 1052. A second substrate 1056 supports the second bonding pad 1054. In an embodiment, the second substrate 1056 is an IC die that is flip-chip mounted to the first substrate 1016.

Figure 11A:
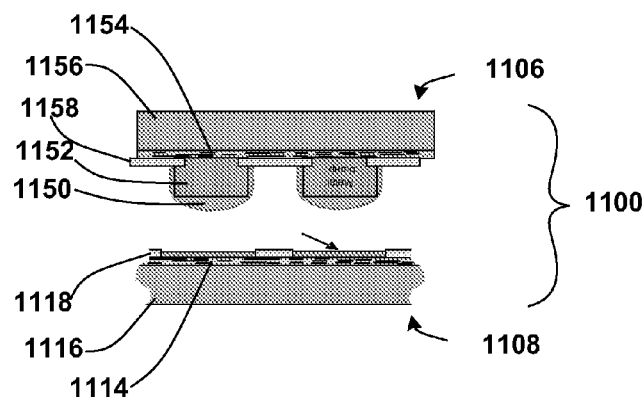
FIG. 11A is a cross-section elevation of a structure after solder cap reflow according to an embodiment.

FIG. 11A is a cross-section elevation of a package 1100 after solder cap reflow according to an embodiment. In a first structure 1108, a first bonding pad 1114 is disposed on a first substrate 1116. The first bonding pad 1114 is exposed through a first solder mask 1118. In an embodiment, the first substrate 1116 is an IC die. In an embodiment, the first substrate 1116 is a mounting substrate such as for mounting a flip-chip IC die. In an embodiment, the first substrate 1116 is a board such as a motherboard.

In a second structure 1106, a second CNT-S microcap 1150 is disposed upon a second metal bump 1152. A second bonding pad 1154 supports the second metal bump 1152. A second substrate 1156 supports the second bonding pad 1154. The second bonding pad 1154 is exposed through a second solder mask 1158. In an embodiment, the second substrate 1156 is an IC die. In an embodiment, the second substrate 1156 is a mounting substrate such as for mounting a flip-chip IC die. In an embodiment, the second substrate 1156 is a board such as a motherboard.

The package 1100 is depicted being brought together such that the first bonding pad 1114 and the second metal bump 1152 are to be in direct contact with the second solder cap 1150. This is because the first bonding pad 1114 and the second solder cap 1150 are to meld and form a continuous reflowed CNT-S microcap.

Processing of the second solder cap 1150 can be done by heating the solder cap materials to a low temperature at which the solder cap materials begin to reflow.

Figure 11B:
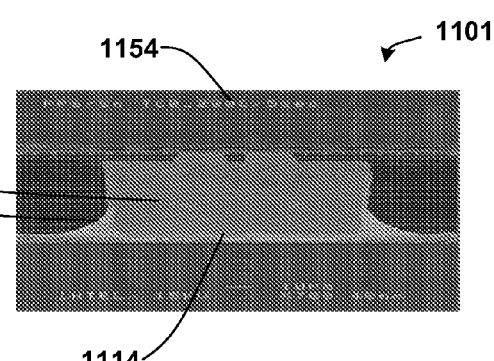
FIG. 11B is a computer-image cross-section elevation depiction of a photomicrograph that exhibits a solder-cap-on-bond-pad configuration of carbon nanotube solder particles disposed upon a metal bump according to an embodiment.

FIG. 11B is a computer-image cross-section elevation depiction of a photomicrograph 1101 that exhibits a solder-cap-on-solder-cap configuration of carbon nanotube solder particles disposed upon a metal bump according to an embodiment. After bringing the structures 1108 and 1106 together (FIG. 11A), and after reflowing the second CNT-S microcap 1150, a structure results that is a configuration of the first bonding pad 1114 with the second CNT-S microcap 1150 disposed and melded therewith, and also with the second bonding pad 1154.

Figure 12:
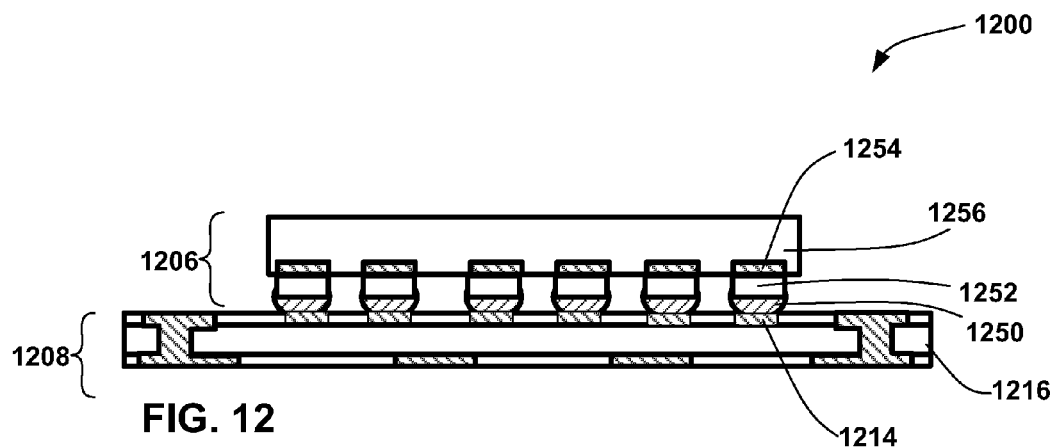
FIG. 12 is a cross-section elevation of a chip package that exhibits a solder-cap-on-bond-pad configuration of carbon nanotube solder particles disposed upon a metal bump according to an embodiment.

FIG. 12 is a cross-section elevation of a chip package 1200 that exhibits a solder-cap 1250 on a bond pad 1254 configuration of carbon nanotube solder particles disposed upon a metal bump 1252 according to an embodiment.

In a first structure 1208, a first substrate 1216 supports a first bonding pad 1214. In an embodiment, the first substrate 1216 is a mounting substrate such as for mounting a flip-chip IC die.

A second CNT-S microcap 1250 is disposed upon a metal bump 1252. A second bonding pad 1254 supports the second metal bump 1252. A second substrate 1256 supports the second bonding pad 1254. In an embodiment, the second substrate 1256 is an IC die that is flip-chip mounted to the second substrate 1256.

Figure 13:
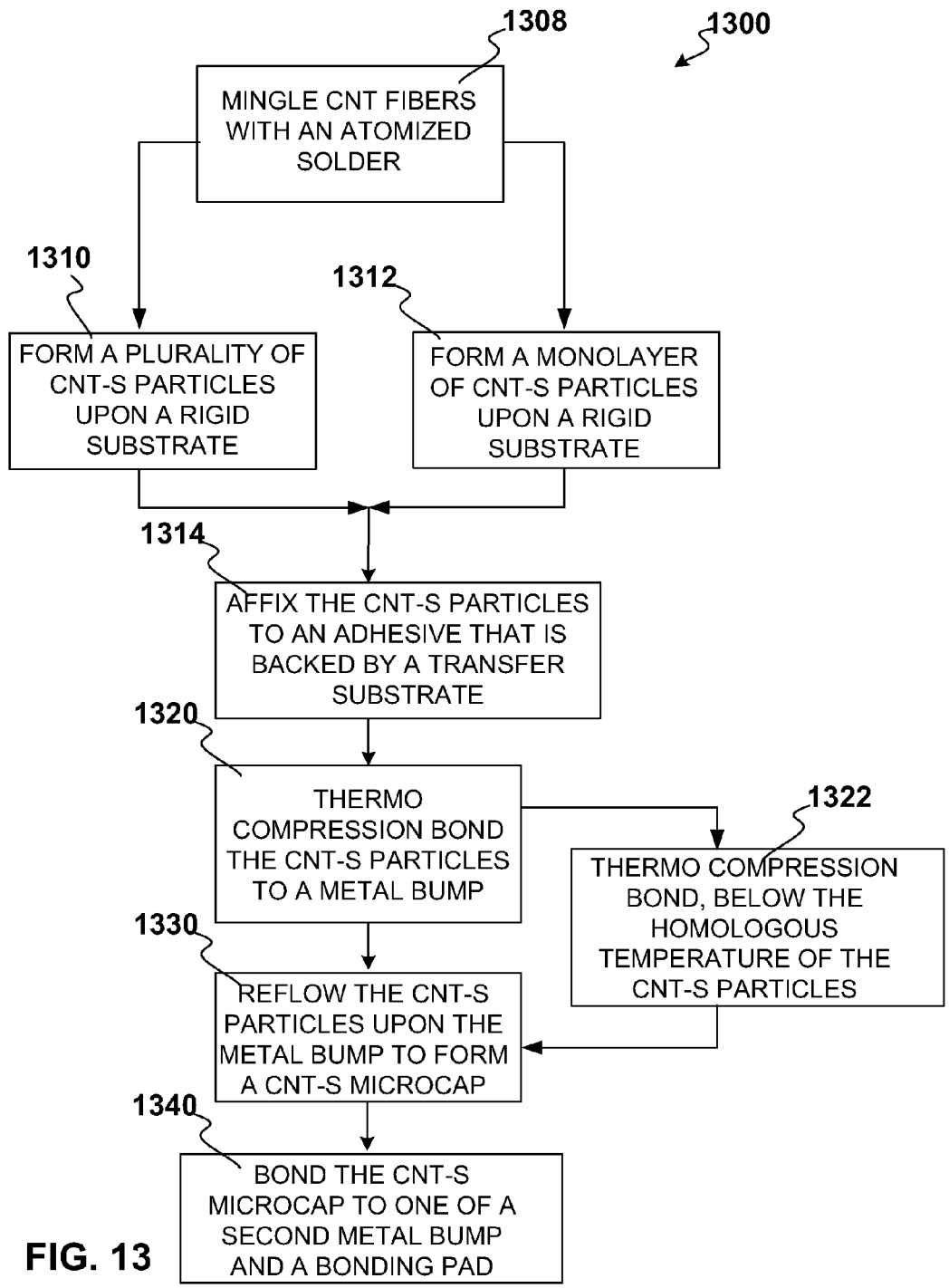
FIG. 13 is a process flow depiction of forming a carbon nanotube solder cap according to an embodiment.

FIG. 13 is a process flow 1300 depiction of forming a carbon nanotube solder cap according to an embodiment.

At 1308, the process includes mingling CNT fibers with an atomized solder to form a CNT-S particle.

At 1310, the process includes forming a plurality of CNT-S particles upon a rigid substrate.

At 1312, the process includes forming a monolayer of CNT-S particles upon a rigid substrate.

At 1314, the process includes affixing the CNT-S composite particles upon an adhesive that is backed by a transfer substrate.

At 1320, the process includes thermo compression transfer bonding the CNT-S composite particle from a transfer substrate to a metal bump. In an embodiment, the process commences and terminates at 1320.

At 1322, the process includes the thermo compression transfer bonding at a temperature that is below the homologous temperature of the CNT-S. In an embodiment, the process commences at 1320 and terminates at 1322.

At 1330, the process includes reflowing the CNT-S upon the metal bump to form a CNT-S microcap. In an embodiment, the process commences at 1320 and terminates at 1330.

At 1340, the process includes bonding the reflowed CNT-S microcap to one of a second metal bump and a bonding pad. In an embodiment, the process commences at 1308 and terminates at 1340. In an embodiment, the process commences at 1310 and terminates at 1340. In an embodiment, the process commences at 1320 and terminates at 1340. In an embodiment, the process commences and terminates at 1340.

Figure 14:
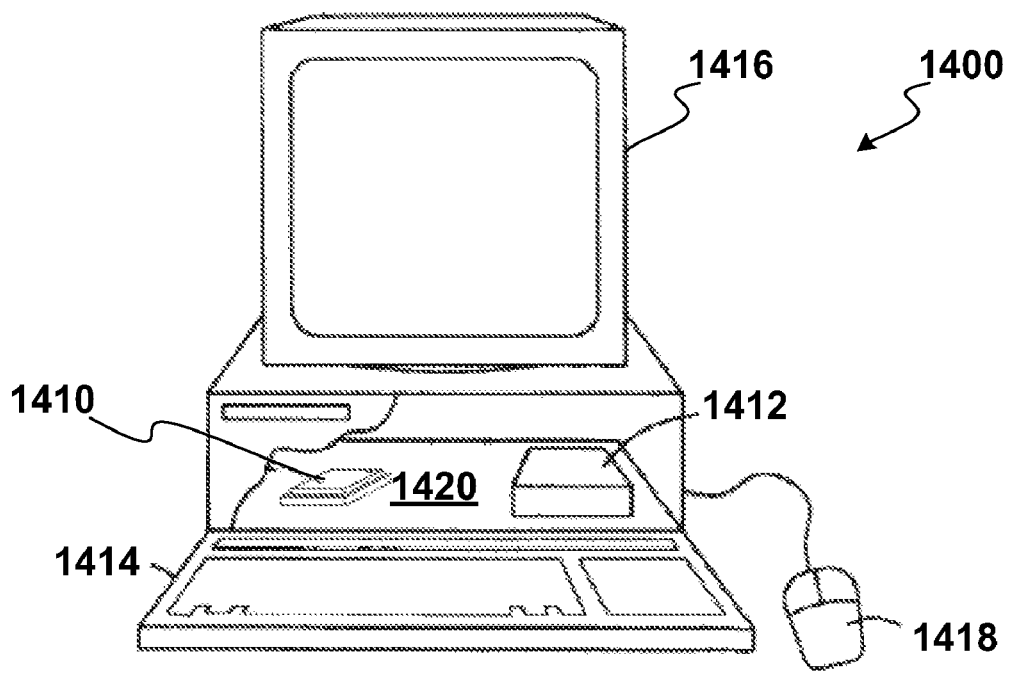
FIG. 14 is a cut-away elevation that depicts a computing system according to an embodiment.

FIG. 14 is a cut-away elevation that depicts a computing system 1400 according to an embodiment. One or more of the foregoing embodiments of the CNT-S microcaps may be utilized in a computing system, such as a computing system 1400 of FIG. 14. Hereinafter any CNT-S microcap embodiments alone or in combination with any other embodiment can be referred to as an embodiment(s) configuration.

The computing system 1400 includes at least one IC processor, which is enclosed in a package 1410, a data storage system 1412, at least one input device such as a keyboard 1414, and at least one output device such as a monitor 1416, for example. The computing system 1400 includes a processor that processes data signals, and may include, for example, a microprocessor, available from Intel Corporation. In addition to the keyboard 1414, the computing system 1400 can include another user input device such as a mouse 1418, for example.

For purposes of this disclosure, a computing system 1400 embodying components in accordance with the claimed subject matter may include any system that utilizes a microelectronic device system, which may include, for example, at least one of the CNT-S microcap embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage system 1412.

In an embodiment, the computing system 1400 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on a board 1420. In this embodiment, an embodiment(s) configuration is coupled to the DSP, and a separate embodiment(s) configuration may be present that is coupled to the processor in the package 1410. Additionally in an embodiment, an embodiment(s) configuration is coupled to a DSP that is mounted on the same board 1420 as the package 1410. It can now be appreciated that the embodiment(s) configuration can be combined as set forth with respect to the computing system 1400, in combination with an embodiment(s) configuration as set forth by the various embodiments of the CNT-S microcaps within this disclosure and their equivalents.

Figure 15:
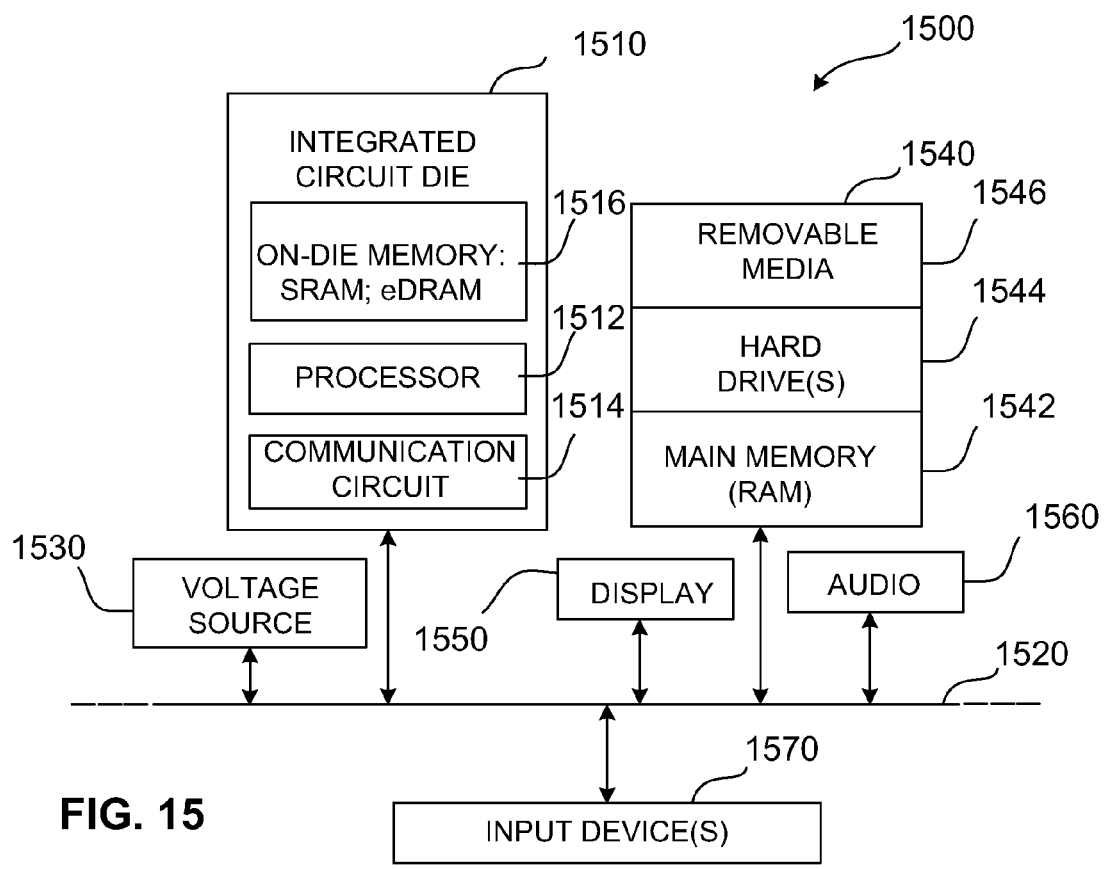
FIG. 15 is a schematic of a computing system according to an embodiment.

FIG. 15 is a schematic of a computing system according to an embodiment. The electronic system 1500 as depicted can embody the computing system 1400 depicted in FIG. 14, including a CNT-S microcap embodiment, but the electronic system is depicted more generically. The electronic system 1500 incorporates at least one electronic assembly 1510, such as an IC package illustrated in FIGS. 9A, 10, 11A, and 12. In an embodiment, the electronic system 1500 is a computer system that includes a system bus 1520 to electrically couple the various components of the electronic system 1500. The system bus 1520 is a single bus or any combination of busses according to various embodiments. The electronic system 1500 includes a voltage source 1530 that provides power to the integrated circuit 1510. In some embodiments, the voltage source 1530 supplies current to the integrated circuit 1510 through the system bus 1520.

The integrated circuit 1510 is electrically coupled to the system bus 1520 and includes any circuit, or combination of circuits according to an embodiment. In an embodiment, the integrated circuit 1510 includes a processor 1512 that can be of any type. As used herein, the processor 1512 means any type of circuit such as, but not limited to, a microprocessor, a microcontroller, a graphics processor, a digital signal processor, or another processor. Other types of circuits that can be included in the integrated circuit 1510 are a custom circuit or an ASIC, such as a communications circuit 1514 for use in wireless devices such as cellular telephones, pagers, portable computers, two-way radios, and similar electronic systems. In an embodiment, the integrated circuit 1510 includes on-die memory 1516 such as SRAM. In an embodiment, the integrated circuit 1510 includes on-die memory 1516 such as eDRAM.

In an embodiment, the electronic system 1500 also includes an external memory 1540 that in turn may include one or more memory elements suitable to the particular application, such as a main memory 1542 in the form of RAM, one or more hard drives 1544, and/or one or more drives that handle removable media 1546 such as diskettes, compact disks (CDs), digital video disks (DVDs), flash memory keys, and other removable media known in the art.

In an embodiment, the electronic system 1500 also includes a display device 1550, an audio output 1560. In an embodiment, the electronic system 1500 includes a controller 1570, such as a keyboard, mouse, trackball, game controller, microphone, voice-recognition device, or any other device that inputs information into the electronic system 1500.

As shown herein, integrated circuit 1510 can be implemented in a number of different embodiments, including an electronic package, an electronic system, a computer system, one or more methods of fabricating an integrated circuit, and one or more methods of fabricating an electronic assembly that includes the integrated circuit and the foamed-solder embodiments as set forth herein in the various embodiments and their art-recognized equivalents. The elements, materials, geometries, dimensions, and sequence of operations can all be varied to suit particular packaging requirements.

It can now be appreciated that CNT-S microcap embodiments set forth in this disclosure can be applied to devices and apparatuses other than a traditional computer. For example, a die can be packaged with an embodiment(s) configuration and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. § 1.72 (b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of this invention may be made without departing from the principles and scope of the invention as expressed in the subjoined claims.

What is claimed is:

1. A process comprising:
   thermo compression transfer bonding a carbon nanotube-solder (CNT-S) composite particle from a transfer substrate to a solder bump.

2. The process of claim 1, further including reflowing the CNT-S upon the solder bump.

3. The process of claim 1, further including:
   reflowing the CNT-S upon the solder bump to achieve a reflowed CNT-S and solder bump; and
   bonding the reflowed CNT-S and solder bump to a bonding pad.

4. The process of claim 1, further including:
   reflowing the CNT-S upon the solder bump to achieve a reflowed first CNT-S and solder bump; and
   bonding the reflowed first CNT-S and solder bump to a second solder bump.

5. The process of claim 1, wherein thermo compression transfer bonding is carried out below the homologous temperature of the CNT-S.

6. The process of claim 1, wherein thermo compression transfer bonding is preceded by affixing the CNT-S composite particle upon an adhesive.

7. The process of claim 1, wherein thermo compression transfer bonding is preceded by:
   forming a plurality of CNT-S particles upon a rigid substrate;
   affixing the CNT-S composite particles upon an adhesive layer; and
   placing the adhesive layer against the transfer substrate.

8. The process of claim 1, wherein thermo compression transfer bonding is preceded by:
   forming a monolayer of CNT-S particles upon a rigid substrate;
   affixing the CNT-S composite particles upon an adhesive layer; and
   placing the adhesive layer against the transfer substrate.

9. The process of claim 1, wherein thermo compression transfer bonding is preceded by mingling carbon nanotube (CNT) fibers with a solder to form the CNT-S particle.

10. A process comprising:
mingling carbon nanotube (CNT) fibers with a solder to form a plurality of carbon nanotube-solder (CNT-S) particles;
placing a the plurality of CNT-S particles upon a rigid substrate;
affixing the CNT-S composite particles upon an adhesive layer;
placing the adhesive layer against a transfer substrate;
thermo compression transfer bonding the plurality of CNT-S particles from the transfer substrate to a solder bump; and
reflowing the CNT-S upon the solder bump to achieve a reflowed CNT-S and solder bump.

11. The process of claim 10, Farther including bonding the reflowed CNT-S and solder bump to a bonding pad.

12. The process of claim 10, wherein reflowing the CNT-S upon the solder bump achieves a reflowed first CNT-S and solder bump, further including:
bonding the reflowed first CNT-S and solder bump to a second solder bump.

13. The process of claim 10, wherein thermo compression transfer bonding is carried out below the homologous temperature of the CNT-S.

14. The process of claim 10, wherein mingling the CNT fibers with a solder to form the plurality of CNT-S particles consists of injecting the CNT fibers into an atomized molten solder, wherein the atomized molten solder is formed with a non-reactive atomizing gas that is virtually the same temperature as the molten solder.

* * * * *

UNITED STATES PATENT AND TRADEMARK OFFICE
CERTIFICATE OF CORRECTION

PATENT NO.       : 7,600,667 B2                          Page 1 of 1
APPLICATION NO.  : 11/537544
DATED            : October 13, 2009
INVENTOR(S)      : Chi-won Hwang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 226 days.

Signed and Sealed this

Fifth Day of October, 2010

David J. Kappos
*Director of the United States Patent and Trademark Office*